(12) United States Patent
Mishima et al.

(10) Patent No.: US 8,674,677 B2
(45) Date of Patent: Mar. 18, 2014

(54) SEMICONDUCTOR INTEGRATED CIRCUIT, SWITCHING POWER SUPPLY, AND CONTROL SYSTEM

(75) Inventors: Takehito Mishima, Tokyo (JP); Tomiyuki Nagai, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 240 days.

(21) Appl. No.: 13/188,744

(22) Filed: Jul. 22, 2011

(65) Prior Publication Data

US 2012/0043952 A1 Feb. 23, 2012

(30) Foreign Application Priority Data

Aug. 23, 2010 (JP) ................. 2010-186389

(51) Int. Cl.
*G05F 3/16* (2006.01)
*G05F 3/02* (2006.01)

(52) U.S. Cl.
USPC .......................................... 323/315; 327/537

(58) Field of Classification Search
USPC ........... 323/312–315, 282, 311; 327/538–540
See application file for complete search history.

(56) References Cited

U.S. PATENT DOCUMENTS

| | | | | |
|---|---|---|---|---|
| 4,857,864 A | * | 8/1989 | Tanaka et al. ................ | 330/288 |
| 5,132,555 A | * | 7/1992 | Takahashi .................... | 326/102 |
| 5,811,861 A | * | 9/1998 | Nunokawa ................... | 257/379 |
| 6,097,064 A | * | 8/2000 | Saitoh et al. ................. | 257/345 |
| 6,100,749 A | * | 8/2000 | Itoh ............................... | 327/530 |
| 6,441,654 B1 | | 8/2002 | Yamamoto | |
| 6,509,854 B1 | * | 1/2003 | Morita et al. ................. | 341/144 |
| 8,392,779 B2 | * | 3/2013 | Schneider et al. ............ | 714/746 |
| 2008/0315856 A1 | * | 12/2008 | Takiba et al. ................. | 323/313 |
| 2009/0121770 A1 | * | 5/2009 | Rankin et al. ................. | 327/328 |
| 2009/0128229 A1 | * | 5/2009 | Watanabe et al. ............. | 327/539 |
| 2010/0039089 A1 | * | 2/2010 | Luzzi et al. ................... | 323/299 |
| 2010/0301824 A1 | * | 12/2010 | Yamamoto et al. ........... | 323/283 |
| 2012/0049829 A1 | * | 3/2012 | Murakami ..................... | 323/288 |

FOREIGN PATENT DOCUMENTS

| | | |
|---|---|---|
| JP | 11-065690 | 3/1999 |
| JP | 2001-077682 | 3/2001 |
| JP | 2006-313438 | 11/2006 |

* cited by examiner

*Primary Examiner* — Timothy J Dole
*Assistant Examiner* — Yusef Ahmed
(74) *Attorney, Agent, or Firm* — IPUSA, PLLC

(57) ABSTRACT

A semiconductor integrated circuit includes a current mirror having a predetermined input-output ratio and including a first transistor configured to receive an input current and a second transistor configured to output an output current, and an output transistor configured to generate a reference voltage according to the output current of the current mirror. The value of the output current is greater than the value of the input current, and the total area of one or more collector regions of the first transistor is substantially the same as the total area of one or more collector regions of the second transistor.

8 Claims, 11 Drawing Sheets

VDB
VDA

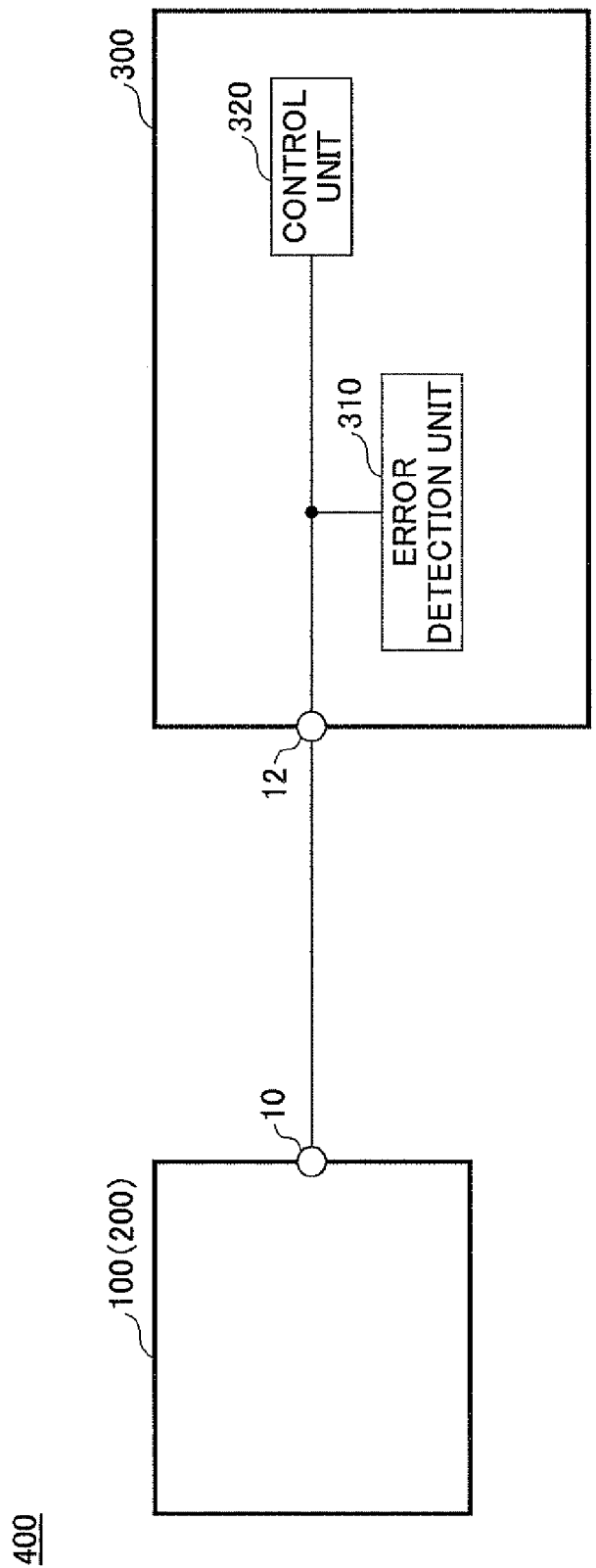

SEMICONDUCTOR INTEGRATED CIRCUIT, SWITCHING POWER SUPPLY, AND CONTROL SYSTEM

CROSS-REFERENCE TO RELATED APPLICATION

The present application is based upon and claims the benefit of priority of Japanese Patent Application No. 2010-186389, filed on Aug. 23, 2010, the entire contents of which are incorporated herein by reference.

BACKGROUND OF THE INVENTION

1. Field of the Invention

An aspect of this disclosure relates to a semiconductor integrated circuit, a switching power supply including the semiconductor integrated circuit, and a control system including the switching power supply.

2. Description of the Related Art

FIG. 1 is a circuit diagram of a step-down switching regulator 100 provided as an example of a switching power supply. The step-down switching regulator 100 is a DC-DC converter that steps down an input voltage VB supplied from an external power supply 1 connected to a pair of power input terminals 2 and 3 and thereby regulates an output voltage VOUT to be output from an output terminal 10 to a target voltage level. The step-down switching regulator 100 includes an input capacitor 4 for smoothing the input voltage VB, a semiconductor integrated circuit 20 including a high-side drive transistor 24 and a low-side drive transistor 25, an inductor 6 whose one end is connected to a node between the high-side drive transistor 24 and the low-side drive transistor 25 and the other end is connected to the output terminal 10, and an output capacitor 9 that is supplied with energy stored in the inductor 6 and smoothes the output voltage VOUT. The drive transistor 24 and/or the drive transistor 25 may be implemented by a semiconductor switching device such as a MOSFET or a bipolar transistor.

The semiconductor integrated circuit 20 also includes a reference voltage generating circuit 21, an oscillator 22, a PWM drive circuit 23, and an error amplifier 26. The PWM drive circuit 23 drives the drive transistors 24 and 25, which in turn drive the inductor 6, using pulse-width modulation according to a synchronous rectification method based on a periodic signal from the oscillator 22 and an amplified-error signal from the error amplifier 26. The PWM drive circuit 23 thereby steps down the input voltage VB supplied from a power supply terminal 27 with respect to a ground terminal 29 to a target voltage level and outputs the stepped-down (regulated) voltage as the output voltage VOUT from the output terminal 10. The error amplifier 26 amplifies the difference between a reference voltage VREF and a feedback voltage VFB. The reference voltage VREF is generated based on the input voltage VB by the reference voltage generating circuit 21 and is smoothed by a capacitor 5 connected to a reference voltage terminal 28. The feedback voltage VFB is obtained by dividing the output voltage VOUT with resistors 7 and 8 and input from a feedback terminal 31.

FIG. 2 is a cut-away side view of the semiconductor integrated circuit 20. The semiconductor integrated circuit 20 includes a P-type semiconductor substrate 41 where an n-type well 42 is formed. An $n^+$-type source region 44 and an $n^+$-type drain region 47 are formed in the n-type well 42. Also, a gate oxide film 45 is formed between the source region 44 and the drain region 47. Thus, the semiconductor integrated circuit 20 of FIG. 2 includes an N-channel MOSFET with a source electrode formed in the source region 44, a drain electrode 53 formed in the drain region 47, and a gate electrode 52 formed in the gate oxide film 45.

Assuming that the N-channel MOSFET corresponds to the low-side drive transistor 25 of FIG. 1, the source region 44 is connected to the ground and the drain electrode 53 is connected to a switch terminal 30 shown in FIG. 1. In this case, the drain electrode 53 corresponds to the node between the drive transistor 24 and the drive transistor 25.

With this configuration, when the drive transistor 24 is turned off, a potential VDB at the drain electrode 53 momentarily drops to a negative potential as illustrated in FIG. 3. Here, a parasitic element 56 is formed as an NPN bipolar transistor where the emitter is implemented by the $n^+$-type drain region 47, the base is implemented by the P-type semiconductor substrate 41, and the collector is implemented by an $n^+$-region 49 of another element (or transistor) formed on the P-type semiconductor substrate 41 of the semiconductor integrated circuit 20. When the potential VDB momentarily drops, the parasitic element 56 draws a current from the $n^+$-region 49 to the P-type semiconductor substrate 41.

This behavior or operation of the parasitic element 56 causes a potential VDA at a drain electrode 54 formed in the $n^+$-region 49 to drop as illustrated in FIG. 3. This in turn may cause the other element using the $n^+$-region 49 and a circuit including the other element to malfunction. In a known technology, a guard ring is used to prevent the above described behavior or operation of a parasitic element and thereby to prevent malfunction (see, for example, Japanese Laid-Open Patent Publication No. 2001-77682).

As described above, the behavior or operation of a parasitic element formed in a semiconductor integrated circuit may destabilize the operation of another circuit formed in the semiconductor integrated circuit. One example of such a circuit destabilized by a parasitic element is a reference voltage generating circuit.

FIG. 4 is a circuit diagram of a reference voltage generating circuit 21A. The reference voltage generating circuit 21A is an example of the reference voltage generating circuit 21 of FIG. 1, and its configuration is disclosed, for example, in Japanese Laid-Open Patent Publication No. 11-65690 and Japanese Laid-Open Patent Publication No. 2006-313438. The reference voltage generating circuit 21A includes a pair of transistors 63 and 65 constituting a current mirror that receives an input current and outputs an output current with a value different from the value of the input current according to a predetermined input-output ratio, and an output transistor 67 that generates a reference voltage VREF according to the output current from the current mirror. In FIG. 4, it is assumed that the collector current of the transistor 65 is N times greater than the collector current of the transistor 63, and a current I flows through a parasitic transistor 68 whose collector is implemented by the collector region of the transistor 63. In this case, a current N×I flows through a parasitic transistor 69 whose collector is implemented by the collector region of the transistor 65. This mechanism is described below with reference to FIG. 5.

FIG. 5 is a drawing illustrating a configuration of a related-art semiconductor integrated circuit including a pair of transistors 63 and 65 constituting a current mirror that outputs an output current with a value different from that of an input current according to a predetermined input-output ratio. In FIG. 5, it is assumed that the collector current of the transistor 65 is two times greater than the collector current of the transistor 63 (i.e., N=2). When a transistor (e.g., the high-side drive transistor 24 in FIG. 1) connected to a drain electrode 53 is driven and a potential VDB of the drain electrode 53 drops to a negative potential, a parasitic element 94 formed as an NPN bipolar transistor operates and causes a parasitic current to flow. When a parasitic current with a current value I flows from an n⁺-type collector region 85 of the transistor 63 through a P-type semiconductor substrate 81 to an n⁺-type drain region 47, a parasitic current with a current value 2×I flows from collector regions 82 and 88 of the transistor 65 through the P-type semiconductor substrate 81 to the drain region 47. This is because the total area of the collector regions 82 and 88 of the transistor 65 is twice the area of the collector region 85 of the transistor 63.

The parasitic currents disrupt the balance of operating currents of the current mirror formed by the transistors 63 and 65. As a result, the reference voltage VREF generated by the output transistor 67 of FIG. 4 deviates from a target value (designed value).

Such unstable operation of a reference voltage generating circuit may lead to unstable operation (e.g., deviation of an output voltage VOUT) of a switching power supply that uses a reference voltage VREF generated by the reference voltage generating circuit. This may further lead to unstable operation (e.g., detection of an abnormal output voltage VOUT) of a control system that uses the output voltage VOUT generated by the switching power supply.

SUMMARY OF THE INVENTION

In an aspect of this disclosure, there is provided a semiconductor integrated circuit that includes a current mirror having a predetermined input-output ratio and including a first transistor configured to receive an input current and a second transistor configured to output an output current, and an output transistor configured to generate a reference voltage according to the output current of the current mirror. The value of the output current is greater than the value of the input current, and the total area of one or more collector regions of the first transistor is substantially the same as the total area of one or more collector regions of the second transistor.

BRIEF DESCRIPTION OF THE DRAWINGS

FIG. 12 is a drawing illustrating a configuration of a control system.

DESCRIPTION OF THE PREFERRED EMBODIMENTS

Preferred embodiments of the present invention are described below with reference to the accompanying drawings.

First Embodiment

Figures 3, 4:
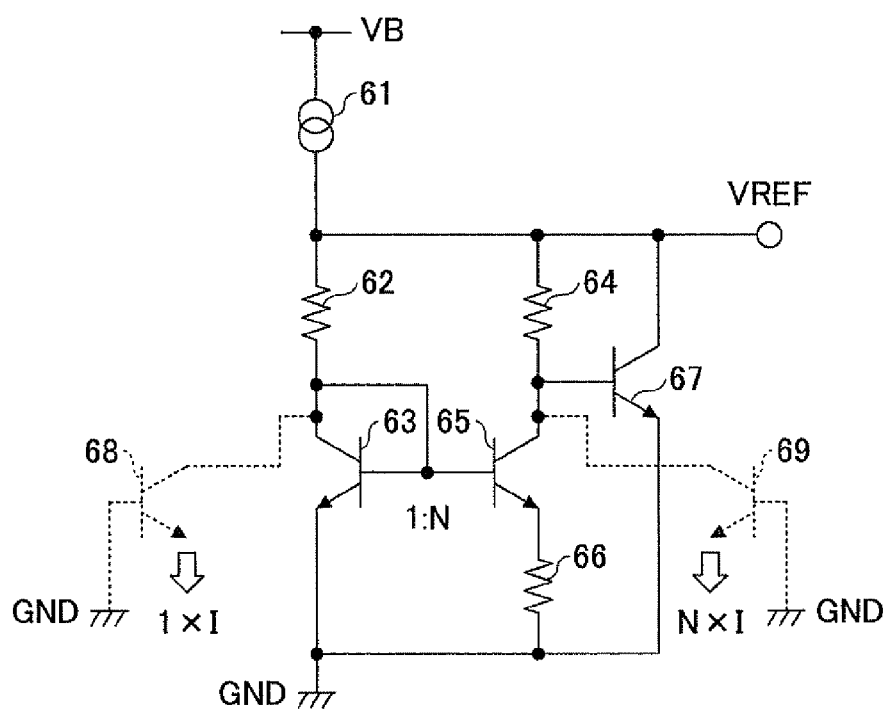
FIG. 3 is a waveform chart showing potential changes.
FIG. 4 is a circuit diagram of a reference voltage generating circuit.
Figure 6:
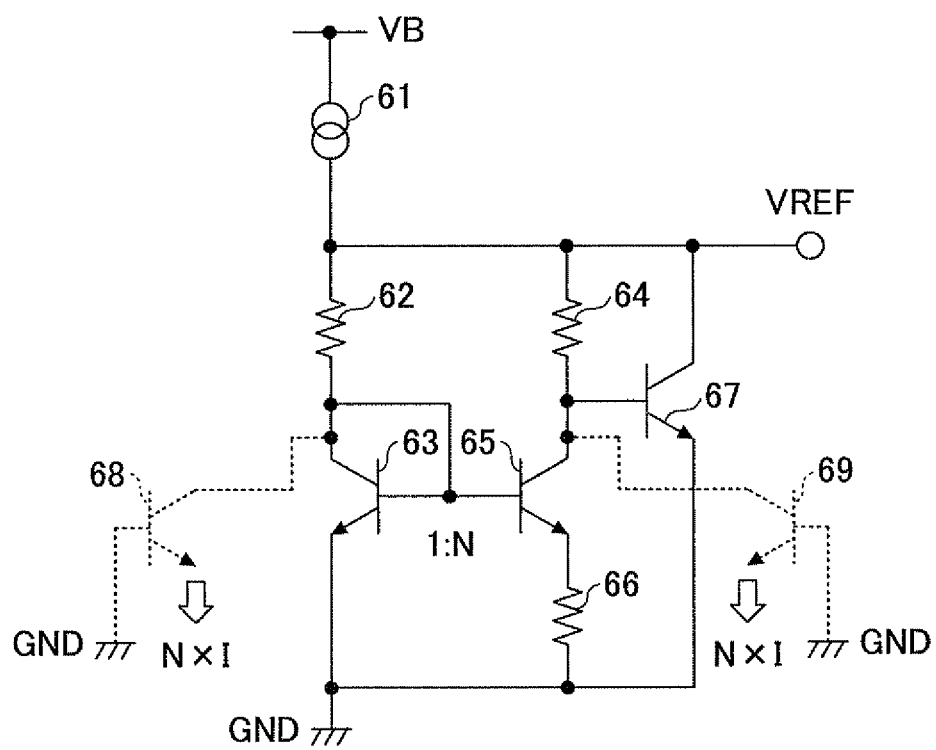
FIG. 6 is a circuit diagram of a reference voltage generating circuit according to a first embodiment.

FIG. 6 is a circuit diagram of a reference voltage generating circuit 21A' of a first embodiment. The reference voltage generating circuit 21A' has a configuration similar to that of the reference voltage generating circuit 21A of FIG. 4. As illustrated in FIG. 6, the collector and the base of a transistor 63 are commonly connected and are also connected via a resistor 62 to the downstream side of a constant-current source 61. The emitter of the transistor 63 is grounded. The collector of a transistor 65 is connected to the base of a transistor 67 and is also connected via a resistor 64 to the downstream side of the constant-current source 61. The emitter of the transistor 65 is grounded via a resistor 66. The collector of the transistor 67 is connected to the downstream side of the constant-current source 61 and the emitter of the transistor 67 is grounded. The upstream side of the constant-current source 61 is connected to an input voltage VB. With this configuration, a constant reference voltage VREF is generated at the collector of the transistor 67.

The transistors 63 and 65 constitute a current mirror with an input-output ratio of 1:N (where N indicates a positive number other than 1). That is, the ratio of the collector current of the input-side transistor 63 (an input current to the current mirror) to the collector current of the output-side transistor 65 (an output current from the current mirror) is 1:N.

Figure 7:
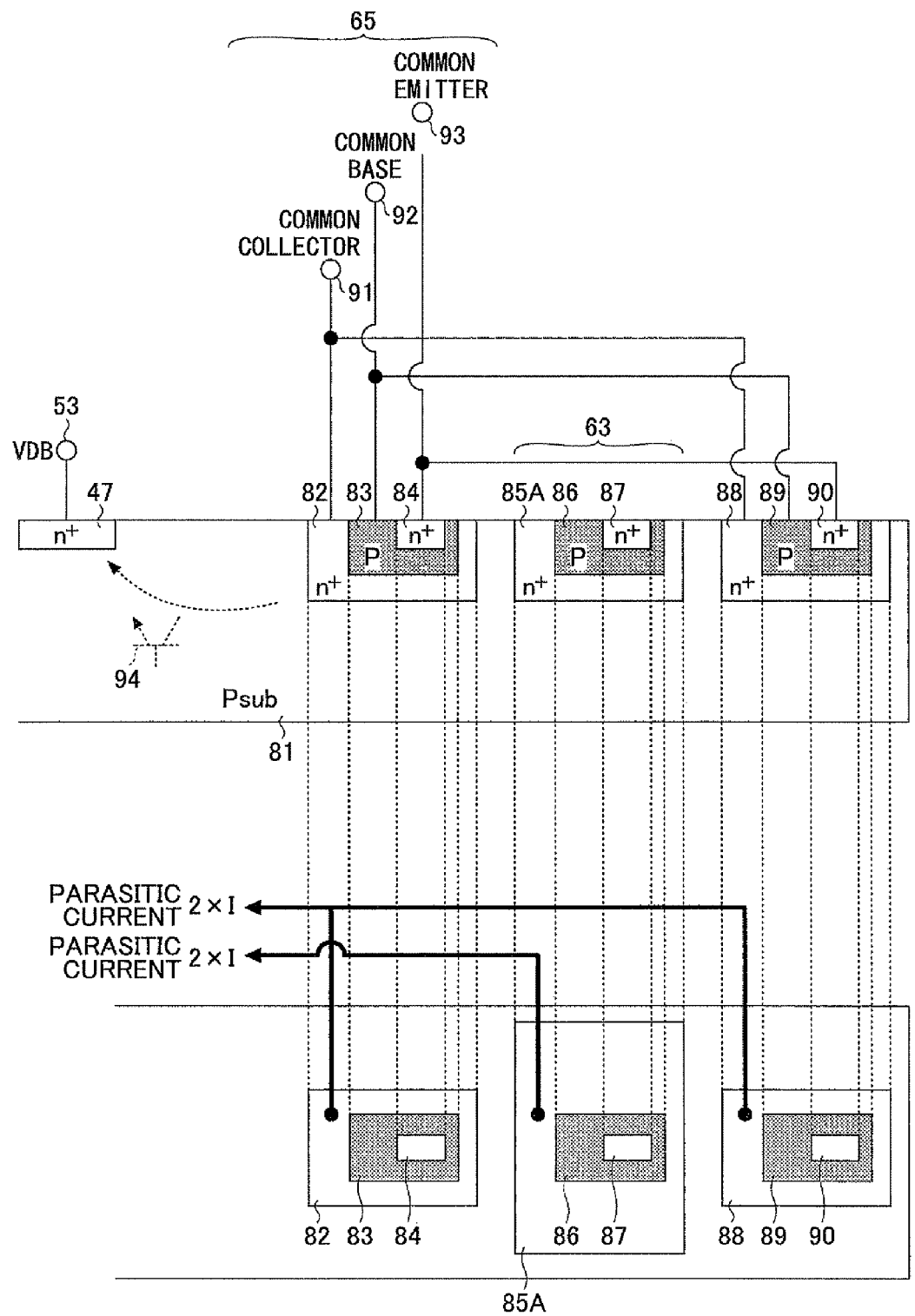
FIG. 7 is a drawing illustrating a configuration of a semiconductor integrated circuit according to the first embodiment.

FIG. 7 is a drawing illustrating a configuration of a semiconductor integrated circuit according to the first embodiment which includes the reference voltage generating circuit 21A' of FIG. 6. In FIG. 7, it is assumed that N=2. Each of the transistors 63 and 65 may be composed of one transistor element or may be composed of two or more transistor elements connected in parallel. In the example of FIG. 7, the transistor 63 is composed of one transistor element and the transistor 65 is composed of two transistor elements connected in parallel. The total area of emitter regions 84 and 90 of the transistor 65 is N times (in this example, two times) greater than the area of an emitter region 87 of the transistor 63. Accordingly, the ratio of the collector current of the input-side transistor 63 (an input current to the current mirror) to the collector current of the output-side transistor 65 (an output current from the current mirror) is 1:2.

In the first embodiment, transistor elements constituting transistors are configured to have substantially the same characteristics. In the example of FIG. 7, the areas of the n⁺-type emitter regions 84, 87, and 90 of the transistors 63 and 65 are substantially the same. Also, the areas of the P-type base regions 83, 86, and 89 of the transistors 63 and 65 are substantially the same.

Further, the area of a collector region 85A of the transistor 63 with a smaller collector current is substantially the same as the total area of collector regions 82 and 88 of the transistor 65 with a larger collector current. With this configuration, even when a potential VDB of a drain electrode 53 drops to a negative potential and a parasitic element 94 formed as an NPN bipolar transistor operates, the balance of operating currents of the current mirror formed by the transistors 63 and 65 is not disrupted. Thus, this configuration makes it possible to prevent unstable operation of the semiconductor integrated circuit caused by the operation of the parasitic element 94.

With the configuration of this embodiment, when the potential VDB of the drain electrode 53 drops to a negative potential and a parasitic current with a current value 2×I flows from the collector regions 82 and 88 of the transistor 65 through a P-type semiconductor substrate 81 to a drain region 47, a parasitic current with the same current value 2×I flows from the collector region 85A of the transistor 63 through the P-type semiconductor substrate 81 to the drain region 47 because the total area of the collector regions 82 and 88 of the transistor 65 is substantially the same as the area of the collector region 85A of the transistor 63. Accordingly, the balance of operating currents of the current mirror formed by the transistors 63 and 65 is not disrupted.

In other words, assuming that a semiconductor integrated circuit includes a first transistor and a second transistor constituting a current mirror, the ratio of the value of the collector current of the first transistor to the value of the collector current of the second transistor is 1:N, and the second transistor includes plural transistor elements whose collector regions have substantially the same area, the total area of collector regions of one or more transistor elements constituting the first transistor may be N times greater than the area of each of the transistor elements constituting the second transistor. This configuration makes it possible to make a parasitic current that flows from the first transistor and a parasitic current that flows from the second transistor to have substantially the same current value (N×I), to prevent disruption of the balance of operating currents of the current mirror formed by the first and second transistors, and thereby to prevent unstable operation of the semiconductor integrated circuit caused by the operation of a parasitic element.

Second Embodiment

Figure 8:
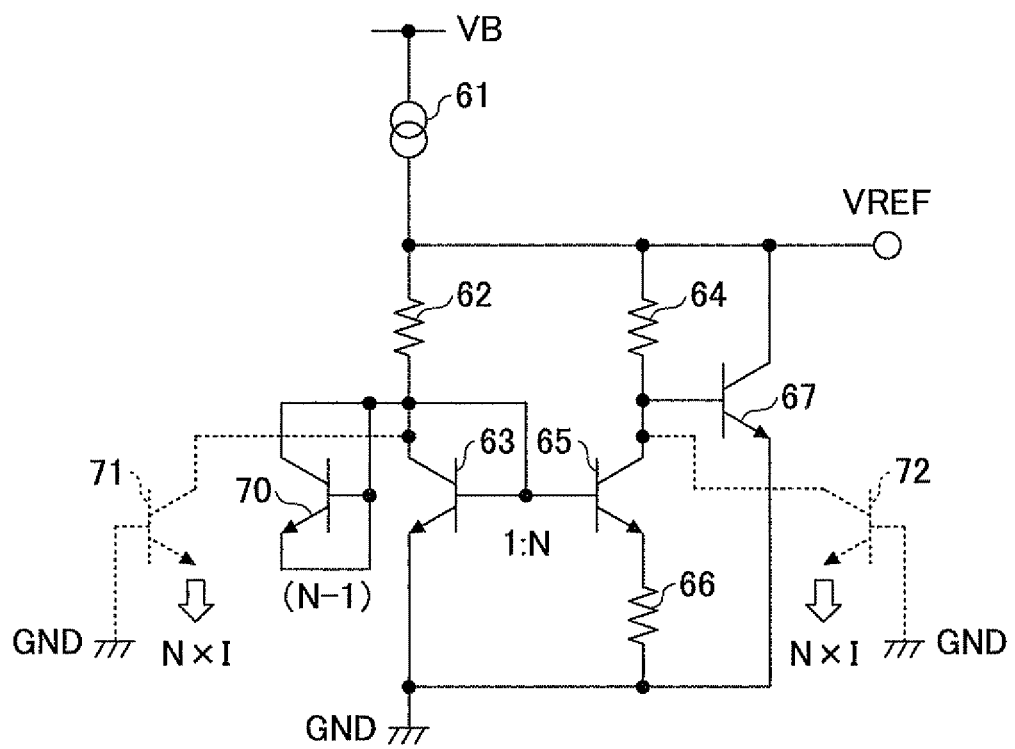
FIG. 8 is a circuit diagram of a reference voltage generating circuit according to a second embodiment.

FIG. 8 is a circuit diagram of a reference voltage generating circuit 21B according to a second embodiment. In the second embodiment, descriptions of components that are the same as those of the first embodiment are omitted. Also in this embodiment, the transistors 63 and 65 constitute a current mirror with an input-output ratio of 1:N (N indicates a positive number other than 1). As illustrated in FIG. 8, the reference voltage generating circuit 21B includes (N−1) transistors 70 in addition to the components shown in FIG. 6. The collector of each of the transistors 70 is connected to the collector of the transistor 63. The base, the emitter, and the collector of each of the transistors 70 are short-circuited to each other so that the transistors 70 do not operate.

With this configuration, when a current N×I flows through a parasitic transistor 72 whose collector is implemented by the collector region of the transistor 65, the same current N×I flows through a parasitic transistor 71 whose collector is implemented by the collector region of the transistor 63. This is because the total area of N collector regions, i.e., (N−1) collector regions of the transistors 70 and one collector region of the transistor 63, is substantially the same as the total area of N collector regions of the transistor 65.

Figure 9:
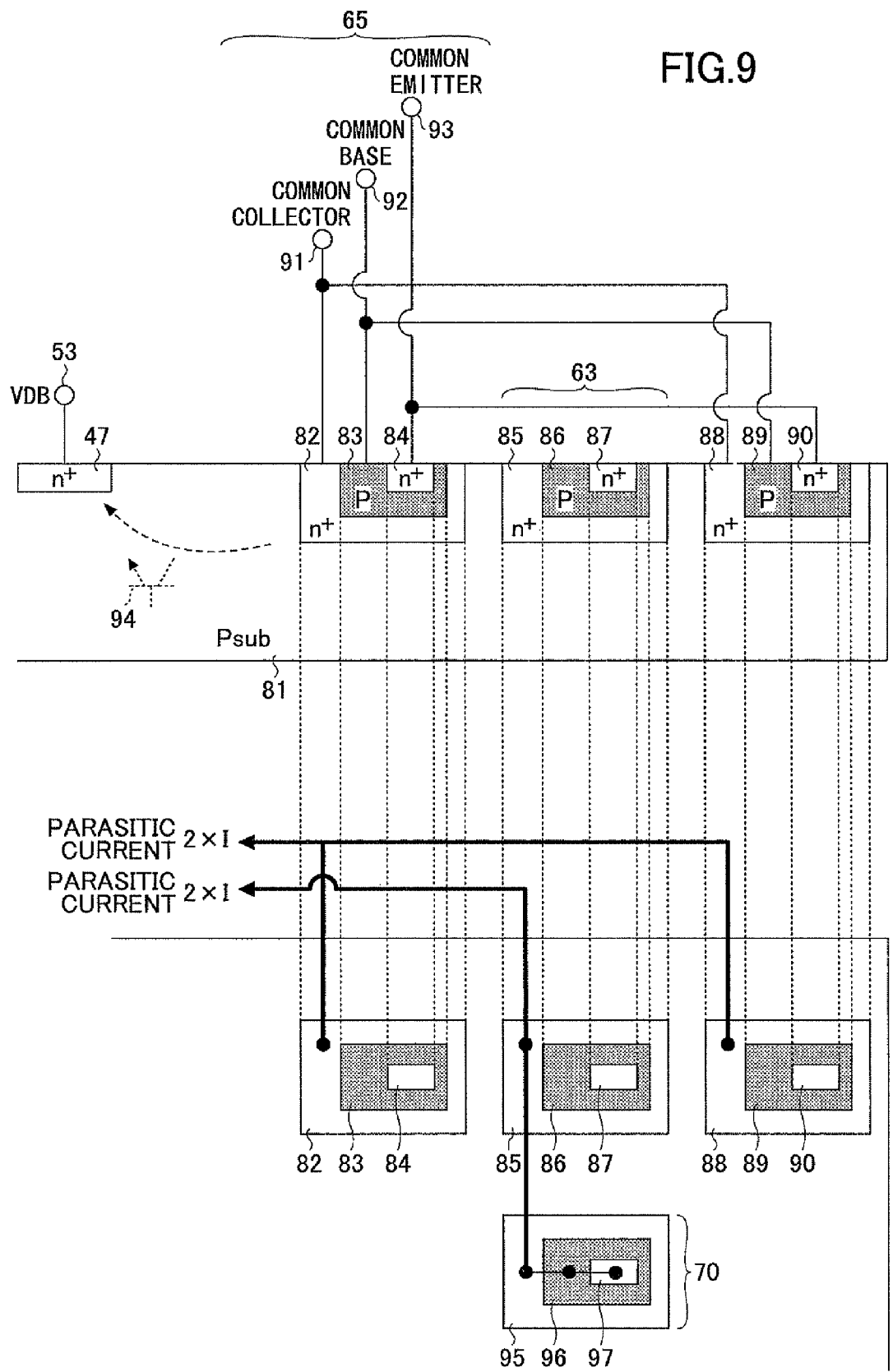
FIG. 9 is a drawing illustrating a configuration of a semiconductor integrated circuit according to the second embodiment.

FIG. 9 is a drawing illustrating a configuration of a semiconductor integrated circuit according to the second embodiment which includes the reference voltage generating circuit 21B of FIG. 8. In FIG. 9, it is assumed that N=2. Here, descriptions of components that are the same as those in FIG. 7 are omitted. In FIG. 9, the total area of collector regions 85 and 95 of the transistor 63 with a smaller collector current is substantially the same as the total area of collector regions 82 and 88 of the transistor 65 with a larger collector current.

With this configuration, when the potential VDB of the drain electrode 53 drops to a negative potential and the parasitic element 94 formed as an NPN bipolar transistor operates, parasitic currents with the same current value 2×I flow at the input side and the output side of the current mirror formed by the transistors 63 and 65 because the total area of the collector regions 82 and 88 of the transistor 65 is substantially the same as the total area of the collector regions 85 and 95 of the transistor 63. Accordingly, this configuration makes it possible to prevent disruption of the balance of operating currents of the current mirror and thereby to prevent unstable operation of the semiconductor integrated circuit caused by the operation of the parasitic element 94.

Figure 1:
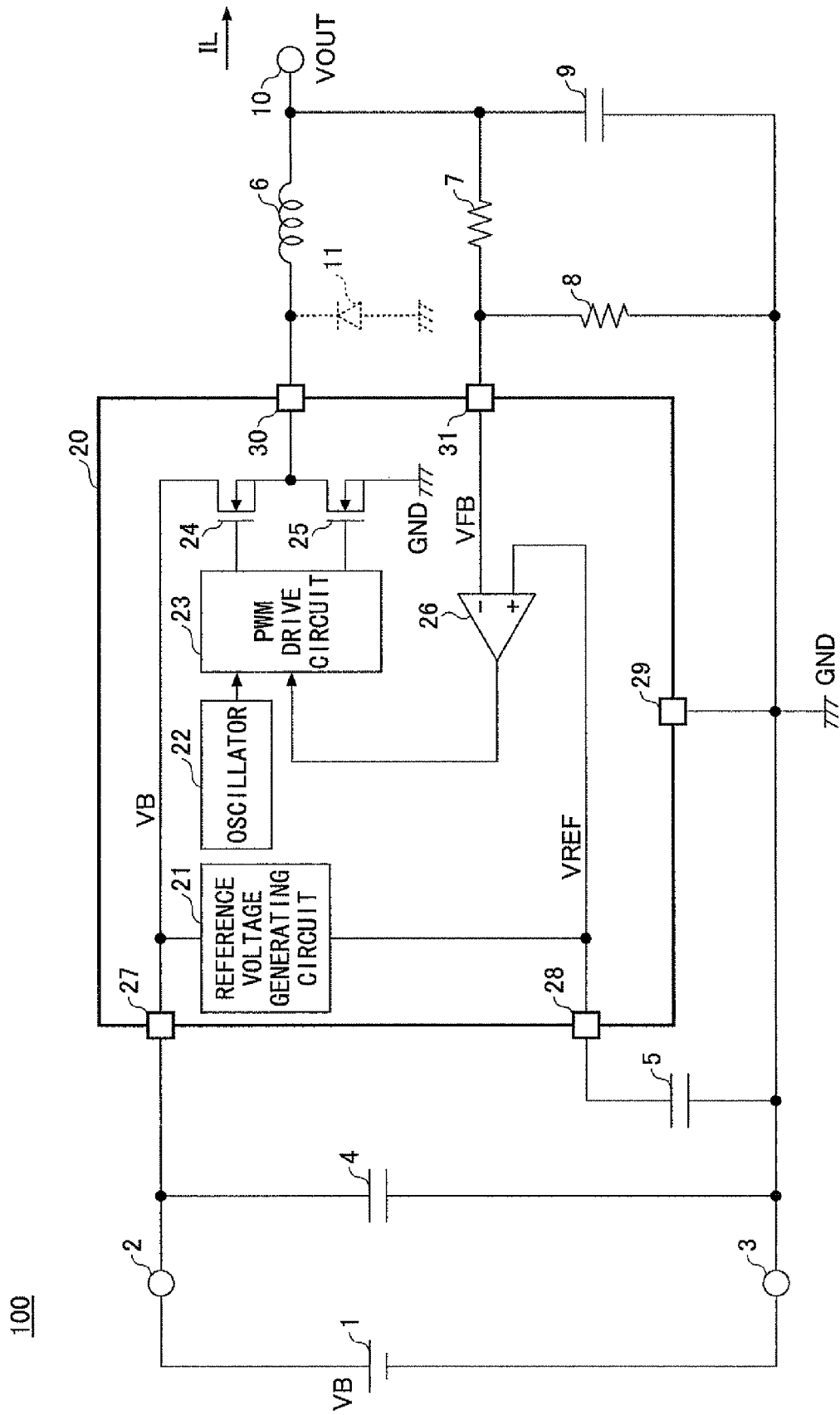
FIG. 1 is a circuit diagram of a step-down switching regulator.
Figure 5:
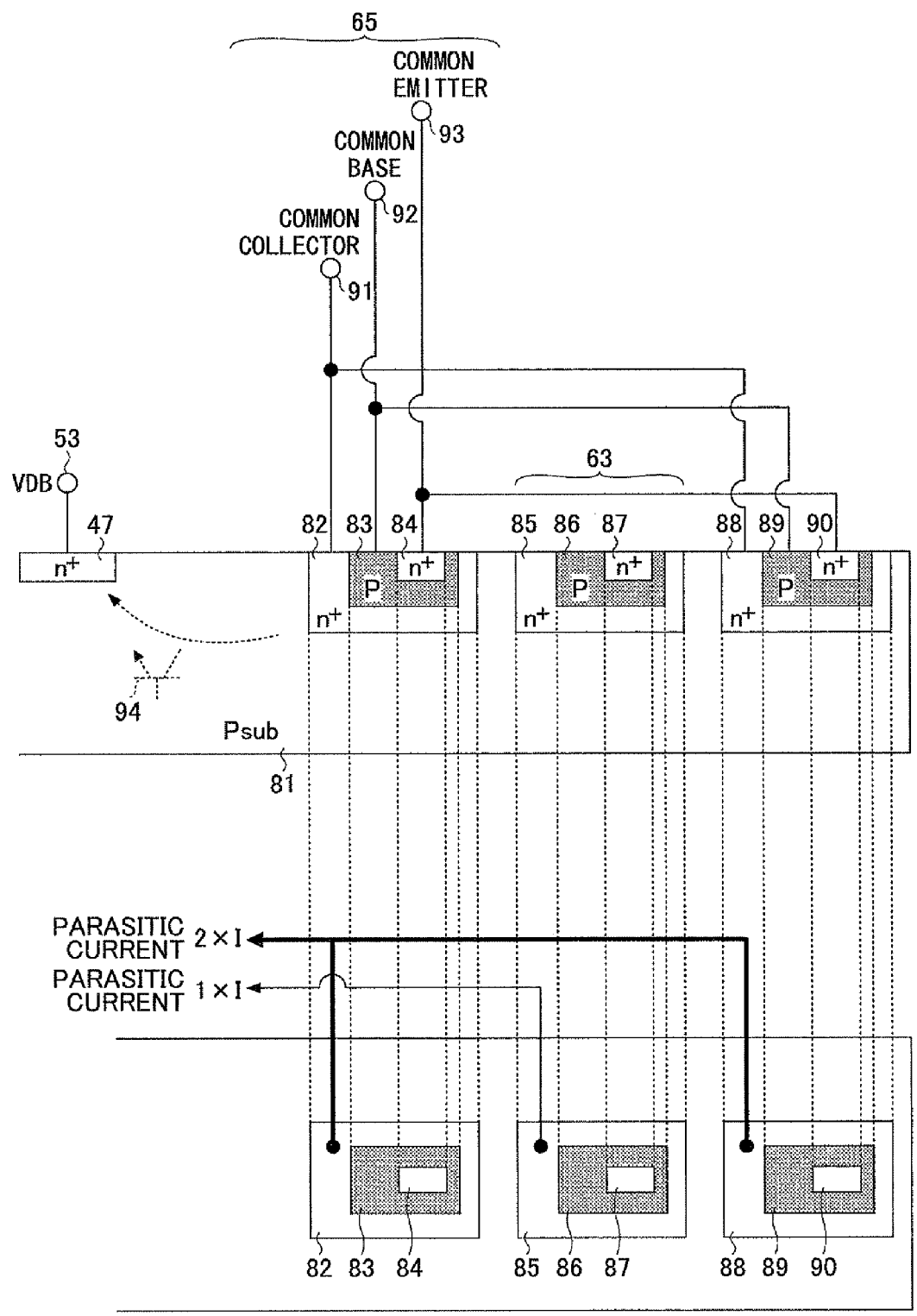
FIG. 5 is a drawing illustrating a configuration of a semiconductor integrated circuit.
Figure 10:
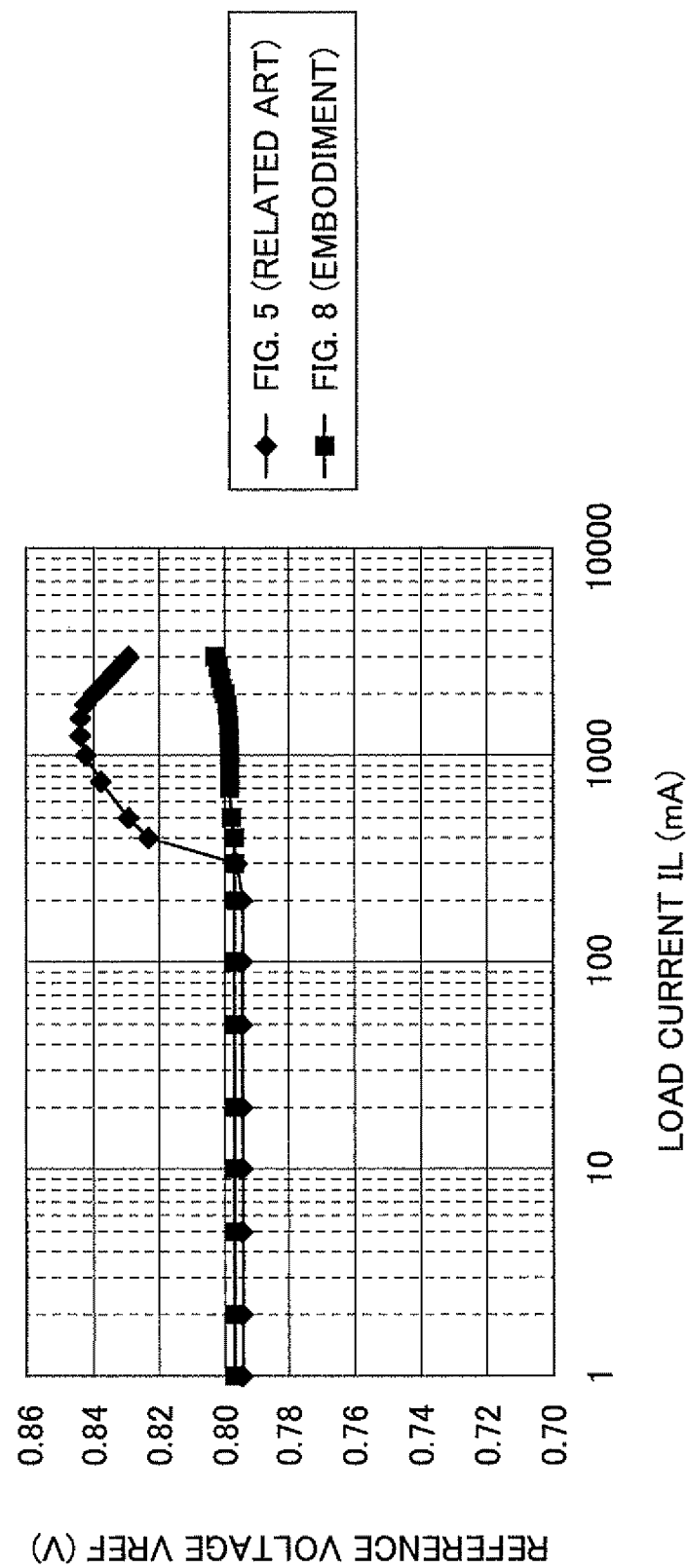
FIG. 10 is a graph showing a relationship between a load current and a reference voltage.

FIG. 10 is a graph showing a relationship between the reference voltage VREF and a load current IL that flows at the output terminal 10 of the step-down switching regulator 100 of FIG. 1 for a first case where the related-art configuration shown in FIG. 5 is used and a second case where the configuration of the second embodiment shown in FIG. 8 is used. As the load current IL increases, the potential VDB of the drain electrode further drops to the negative side and the possibility that the reference voltage generating circuit 21 becomes unstable increases. With the configuration of FIG. 5, the reference voltage VREF increases when the load current IL is in a high range. Meanwhile, with the configuration of FIG. 8, the reference voltage VREF remains constant.

Figure 2:
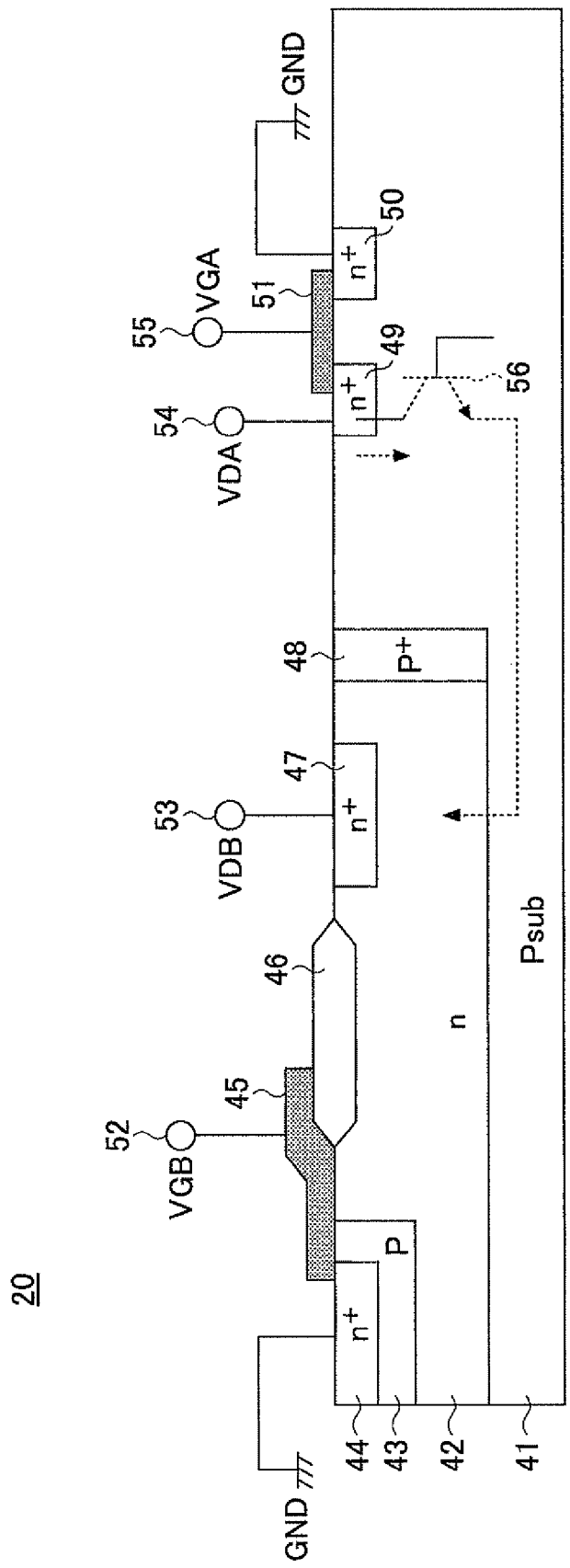
FIG. 2 is a cut-away side view of semiconductor integrated circuit.

The embodiments of the present invention may be applied, for example, to the semiconductor integrated circuit 20 and the step-down switching regulator 100 of FIGS. 1 and 2.

Preferred embodiments of the present invention are described above. However, the present invention is not limited to the specifically disclosed embodiments, and variations and modifications may be made without departing from the scope of the present invention.

For example, in the step-down switching regulator 100 of FIG. 1, the drive transistor 25 may be replaced with a diode 11 or the diode 11 may be added at a position between the inductor 6 and the node between the drive transistors 24 and 25 so that the inductor 6 is driven according to a diode rectification method (or asynchronous rectification method). As another example, in the step-down switching regulator 100 of FIG. 1, the N-channel or NPN-type drive transistor 24 may be replaced with a P-channel or PNP-type drive transistor and the drive transistor 25 may be removed so that the inductor 6 is driven according to a diode rectification method (or asynchronous rectification method).

Figure 11:
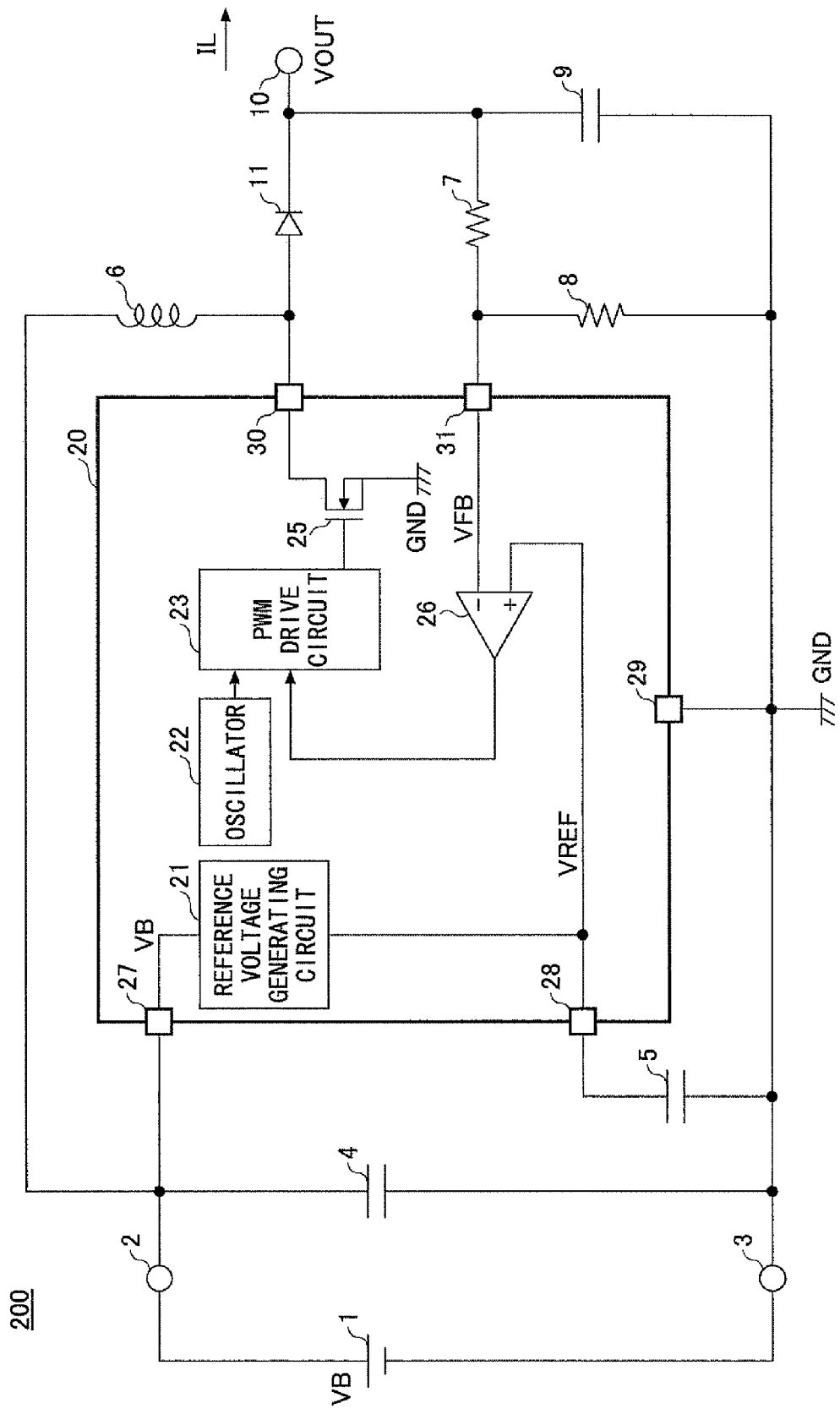
FIG. 11 is a circuit diagram of a step-up switching regulator.

The present invention may also be applied to a step-up switching regulator. FIG. 11 is a circuit diagram of a step-up switching regulator 200. In the case of the step-up switching regulator 200, the potential of a ground, to which the source electrode of the drive transistor 25 for driving the inductor 6 is connected, tends to change, and therefore the reference voltage VREF that is generated based on the ground potential tends to deviate. Applying the embodiments of the present invention to the step-up switching regulator 200 makes it possible to effectively prevent this problem.

The embodiments of the present invention also make it possible to prevent unstable operation of a control system including a controller that uses the output voltage VOUT generated by a switching power supply based on the reference voltage VREF. FIG. 12 is a drawing illustrating a configuration of a control system 400 including the switching regulator 100 (or 200) and a controller 300 that uses the output voltage VOUT generated by the switching regulator 100 (or 200). The output voltage VOUT is input to an input terminal 12 of the controller 300.

The controller 300 includes an error detection unit 310 for detecting an error in the output voltage VOUT (or an abnormal output voltage VOUT) and a control unit 320 that receives the output voltage VOUT as a supply voltage. When the controller 300 is implemented by a microcomputer, the control unit 320 may correspond to a central processing unit. Applying the reference voltage generating circuit (21A' or 21B) of the above embodiments to the switching regulator 100 (or 200) of the control system 400 makes it possible to prevent the output voltage VOUT from being affected by the operation of a parasitic element and thereby makes it possible to prevent the error detection unit 310 from detecting an abnormal output voltage VOUT. In other words, this configuration makes it possible to provide a stable output voltage VOUT to the control unit 320.

What is claimed is:

1. A semiconductor integrated circuit, comprising:
   a current mirror having a predetermined input-output ratio and including a first transistor having a transistor element configured to receive an input current and a second transistor having two or more transistor elements configured to output an output current; and
   an output transistor configured to generate a reference voltage according to the output current of the current mirror,
   wherein a value of the output current is N times greater than a value of the input current, with N being a positive integer greater than one,
   wherein the one or more transistor elements of the second transistor have one or more collector layer regions having substantially a same total surface area in a surface pattern layout, and
   wherein a total surface area of a collector layer region of the transistor element of the first transistor in a surface pattern layout is N times greater than the total surface area of each of the collector layer regions of the second transistor in a surface pattern layout.

2. The semiconductor integrated circuit as claimed in claim 1, wherein a total area of one or more emitter regions of the first transistor is different from a total area of one or more emitter regions of the second transistor.

3. A switching power supply, comprising:
   the semiconductor integrated circuit of claim 1, the semiconductor integrated circuit further including a drive transistor;
   an inductor configured to be driven by the drive transistor; and
   a capacitor configured to be supplied with energy stored in the inductor,
   wherein the drive transistor is configured to drive the inductor based on the reference voltage generated by the semiconductor integrated circuit and a feedback voltage obtained from an output voltage generated by the capacitor to make the output voltage constant.

4. The switching power supply as claimed in claim 3, wherein the switching power supply is a step-down switching regulator.

5. The switching power supply as claimed in claim 3, wherein the switching power supply is a step-up switching regulator.

6. A control system, comprising:
   the switching power supply of claim 3; and
   a controller including an error detection unit configured to detect an error in the output voltage.

7. The control system as claimed in claim 6, wherein the controller is implemented by a microcomputer.

8. A semiconductor integrated circuit, comprising:
   a current mirror having a predetermined input-output ratio and including a first transistor configured to receive an input current and a second transistor configured to output an output current;
   at least one third transistor including a base region, an emitter region, and a collector region that are short-circuited to each other; and
   an output transistor configured to generate a reference voltage according to the output current of the current mirror, wherein
   a value of the output current is greater than a value of the input current;
   the collector region of the third transistor is connected to a collector region of the first transistor; and
   a total area of the collector regions of the first transistor and the third transistor is substantially the same as a total area of one or more collector regions of the second transistor.

* * * * *